(12) United States Patent
Takahashi

(10) Patent No.: US 7,304,861 B2
(45) Date of Patent: Dec. 4, 2007

(54) CABLE CLAMP

(75) Inventor: Hideaki Takahashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/369,841

(22) Filed: Mar. 8, 2006

(65) Prior Publication Data

US 2007/0137888 A1    Jun. 21, 2007

(30) Foreign Application Priority Data

Dec. 19, 2005    (JP)    ............... 2005-364687

(51) Int. Cl.
*H05K 7/02* (2006.01)
*F16L 3/00* (2006.01)

(52) U.S. Cl. .............. 361/760; 361/807; 361/809; 248/74.3

(58) Field of Classification Search ............. 361/826, 361/760, 807–810, 827; 174/72 A, 138 G; 248/74.1–74.4
See application file for complete search history.

(56) References Cited

U.S. PATENT DOCUMENTS

| | | | | |
|---|---|---|---|---|
| 3,659,319 A | * | 5/1972 | Erickson ................ | 24/304 |
| 4,457,482 A | * | 7/1984 | Kitagawa ................ | 248/74.3 |
| 4,669,688 A | * | 6/1987 | Itoh et al. .............. | 248/74.2 |
| 5,230,489 A | * | 7/1993 | White et al. ............ | 248/74.2 |
| 5,949,020 A | * | 9/1999 | Mitchell et al. ........ | 174/40 CC |
| 6,164,603 A | * | 12/2000 | Kawai ................... | 248/73 |
| 6,669,149 B2 | * | 12/2003 | Akizuki ................. | 248/71 |
| 6,724,637 B2 | * | 4/2004 | Li et al. ................ | 361/760 |
| 6,924,437 B1 | * | 8/2005 | Creekmore et al. ..... | 174/138 G |

FOREIGN PATENT DOCUMENTS

| | | |
|---|---|---|
| JP | 2-297503 | 12/1990 |
| JP | 10-26262 | 1/1998 |
| JP | 2001-148584 | 5/2001 |

* cited by examiner

*Primary Examiner*—Dean A. Reichard
*Assistant Examiner*—Dameon E. Levi
(74) *Attorney, Agent, or Firm*—Kratz, Quintos & Hanson, LLP

(57) ABSTRACT

An object of the present invention is to provide a cable clamp which can be installed on a printed wiring board automatically without forming a through hole in the printed wiring board. A cable clamp (1), which is installed on a printed wiring board (20) to hold cables (21,21, . . . ) at predetermined positions on the printed wiring board (20), includes: a cable holding part (11) for holding the cables (21,21, . . . ); an opening and closing part (12) for opening and closing the cable holding part (11); a suction part (15), which is provided on the opening and closing part (12), to be sucked by suction unit (22) used to mount electronic parts on the printed wiring board (20); and a part to be soldered (13) to the printed wiring board (20).

8 Claims, 8 Drawing Sheets

CABLE CLAMP

BACKGROUND OF THE INVENTION

1. Field of the Invention

The present invention relates to a cable clamp for holding cables or optical fibers at predetermined positions on a printed wiring board.

2. Description of the Related Technology

A cable clamp is used to hold cables or optical fibers at predetermined positions on a printed wiring board.

In the conventional art, to install the cable clamp on a printed wiring board, a through hole 71 is formed in a printed wiring board 70, and a projection 73 provided on a resin cable clamp 72 is press fitted in the through hole 71 manually, as shown in FIGS. 7 and 8 (refer to JP 10-26262 A and JP 02-297503 A, for example).

FIG. 7 shows a state of the cable clamp 72 before it is fixed on the printed wiring board 70 and FIG. 8 shows a state of the cable clamp 72 after it is fixed on the printed wiring board 70. The reference numeral 74 in FIGS. 7 and 8 denotes mounted parts.

In the conventional art, as shown in FIG. 9, a double coated adhesive tape 83 is affixed to the bottom of a cable clamp 82 without forming a through hole in a printed wiring board 80 to fix the cable clamp 82 on the printed wiring board 80 manually by the adhesive force of the double coated adhesive tape 83.

Further, there is known a technology for fixing a cable clamp in such a way that the cable clamp is divided into two parts: the one to be fixed on a printed wiring board; and the other for holding cables, and the part to be fixed on the printed wiring board is first fixed on the printed wiring board by soldering, to which the part for holding cables is attached (refer to JP 2001-148584 A, for example).

However, according to the conventional method which involves forming the through hole 71 in the printed wiring board 70 to press fit the projection 73 of the cable clamp 72 into the through hole 71 (see FIGS. 7 and 8), the through hole 71 formed in the printed wiring board 70 decreases the part mounting area on a side opposite to the cable clamp 72 mounting side, or lowers the degree of freedom of designing the wiring pattern of the printed wiring board 70.

Since the circular through hole 71 is generally used to hold the cable clamp 72, the cable clamp 72 may turn with the projection 73 press fitted in the through hole 71 as the axis of rotation when or after it is installed and accordingly may interfere with another mounted part 74 adjacent thereto or may be installed in a direction different from that intended by a designer, thereby making it impossible to hold cables or optical fibers in a right direction.

The installation position and direction of the cable clamp 72 on the printed wiring board 70 and the type of the cable clamp 72 greatly differ according to the printed wiring board 70 to be assembled.

Therefore, according to the conventional method which involves forming the through hole 71 in the printed wiring board 70 to press fit the cable clamp 72 in the through hole 71 (see FIGS. 7 and 8) and to the other conventional method which involves affixing the double coated adhesive tape to the bottom of the cable clamp 82 to fix the cable clamp 82 on the printed wiring board 80 by the adhesive force of the double coated adhesive tape 83 (see FIG. 9), it is difficult to automatically assemble the printed wiring board by a machine, and assembly work must be carried out manually.

Accordingly, the work efficiency of installing the cable clamp 72 or 82 is impaired and a mistake such as that a worker fails to install the cable clamp may be caused.

The same problems occur according to the method which involves dividing the cable clamp into a part to be fixed on the printed wiring board and a part for holding cables.

SUMMARY OF THE INVENTION

The present invention has been made in view of the above problems, and it is an object of the present invention to provide a cable clamp which can be installed on a printed wiring board automatically without forming a through hole in the printed wiring board.

In order to achieve the above object, the present invention applies the following devices.

(1) The present invention provides a cable clamp, which is installed on a printed wiring board to hold cables at predetermined positions on the printed wiring board, comprising; a cable holding part holding the cables; a suction part to be sucked by suction means used to mount electronic parts on the printed wiring board; and a part to be soldered to the printed wiring board.

According to the present invention, the suction part which is formed flat can be sucked by the suction means used to mount electronic parts on the printed wiring board. Further, the part to be soldered can be soldered to the printed wiring board. Therefore, the cable clamp according to the present invention can be automatically installed on the printed wiring board by an automatic assembly machine for electronic parts. At the same time, it is not necessary to form a hole in the printed wiring board.

(2) Further, the cable clamp be formed such that it can be stored in container-like conveyor devices having an opening taking out the cable clamp;

the suction part and the part to be soldered be provided on the opposite sides of the cable holding part; and the suction part be exposed outward from the opening of the conveyor devices while it is stored in the conveyor devices.

In this case, a plurality of cable clamps can be carried by container-like conveyor devices, and the suction part exposed outward from the opening of the conveyor devices can be sucked by the suction devices so that its cable clamp can be taken out from the conveyor devices.

Further, the cable clamp is carried by the suction devices and unloaded at a predetermined position of the printed wiring board so that the cable clamp is placed on the printed wiring board in such a manner that the part to be soldered of the cable clamp is brought into abut with parts to be soldered such as the foot prints of the printed wiring board.

Accordingly, the part to be soldered of the cable clamp can be soldered to the foot prints of the printed wiring board by a reflow treatment or the like.

(3) Further, the cable holding part, the suction part, and the part to be soldered can be integrally formed of a solderable metal. In this case, the cable clamp can be manufactured easily.

(4) Further, the cable holding part is preferably provided with an elastic opening and closing part. In this case, the opening and closing part is opened and closed using elasticity.

(5) Further, the cable holding part is preferably provided with a plastic deformable opening and closing part. In this case, the opening and closing part is opened and closed using plasticity.

(6) Further, the part to be soldered is preferably provided with a hole having a predetermined size. In this case, when the part to be soldered is soldered to the printed wiring board, heat applied to the part to be soldered readily spreads to the entire part to be soldered, thereby making it possible to carry out soldering securely in a short period of time.

(7) Further, the cable holding part and the suction part are preferably formed of a resin, and the part to be soldered is composed of a metal lead. In this case, the cable clamp can be manufactured easily.

As described above, according to the present invention, the cable clamp can be installed on the printed wiring board without forming a hole in the printed wiring board.

Therefore, a reduction in the part mounting area of the printed wiring board and a reduction in the degree of freedom of designing the wiring pattern of the printed wiring board can be suppressed.

Since the cable clamp is soldered to the printed wiring board to be secured to the printed wiring board and does not turn, it is possible to prevent the cable clamp from interfering with another mounted part adjacent thereto and from being installed in a direction different from that intended by a designer, and to hold cables such as electric wires or optical fibers in a right direction.

Further, since the cable clamp of the present invention can be installed on the printed wiring board by an automatic assembly machine as in the case of installing electronic parts, the efficiency of installation work can be improved and a mistake such as that a worker fails to install the cable clamp can be prevented.

DETAILED DESCRIPTION OF THE INVENTION

First Embodiment

Figure 1:
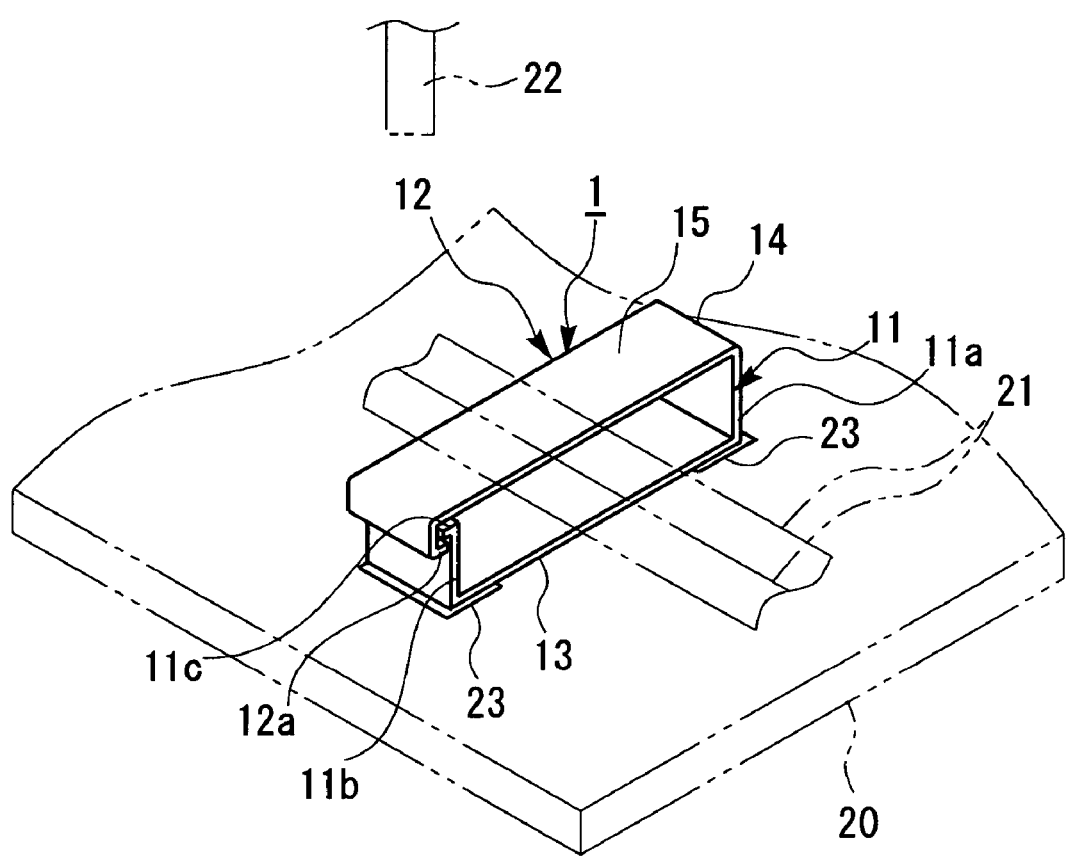
FIG. 1 is a perspective view of a cable clamp according to a first embodiment of the present invention.
Figure 2:
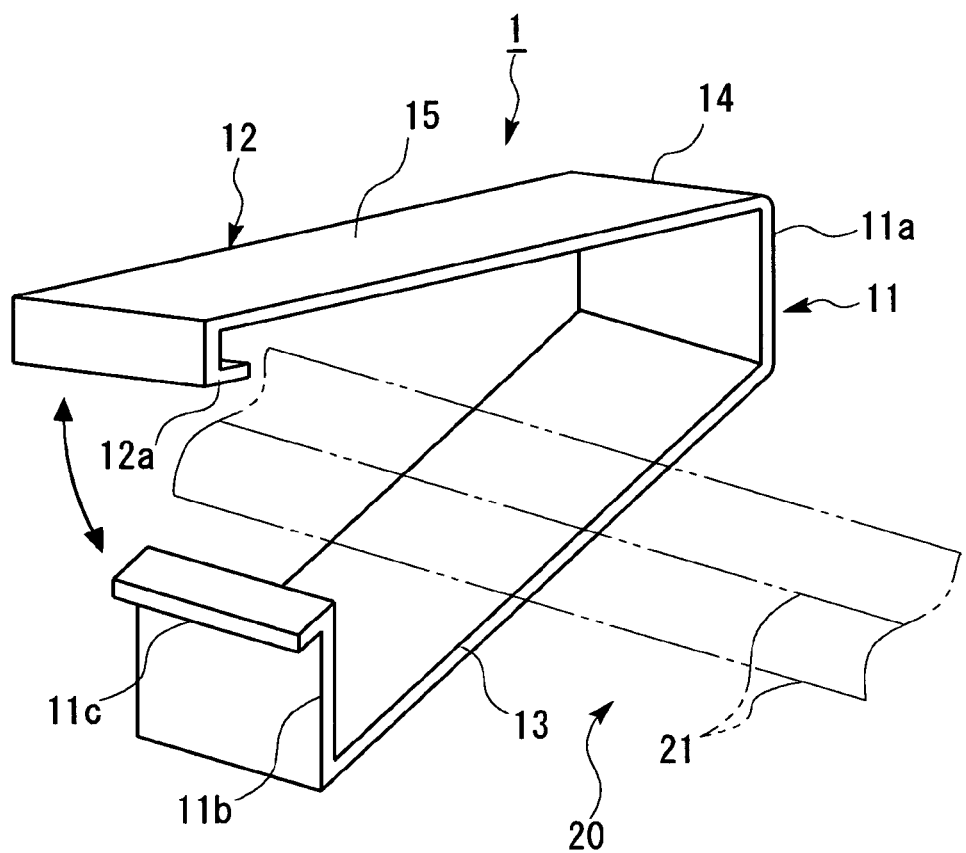
FIG. 2 is a perspective view showing a state in which the opening and closing part of the cable clamp according to the first embodiment of the present invention is opened.

FIG. 1 shows a cable clamp 1 according to a first embodiment of the present invention. The cable clamp 1 is installed on a printed wiring board 20 in order to hold cables 21, 21, . . . at predetermined positions on the printed wiring board (printed substrate) 20.

This cable clamp 1 includes a substantially U-shaped cable holding part 11 for holding the above cables 21, 21, . . . , an opening and closing part 12 for opening and closing the cable holding part 11, and a part to be soldered 13 to the foot prints 23 or the like of the printed wiring board 20.

The above opening and closing part 12 is provided with a suction part 15 to be sucked by suction means 22 used to mount electronic parts (not shown) on the printed wiring board 20. In this embodiment, the suction part 15 is formed on the flat surface of the opening and closing part 12. This suction part 15 also serves as a lock part for locking the cables.

The above cable holding part 11, the opening and closing part 12, and the part to be soldered 13 are integrally molded out of a solderable metal, for example, a copper alloy.

The cable clamp 1 is formed like a substantially rectangular frame. The above part to be soldered 13 constitutes the bottom of the cable holding part 11. The opening and closing part 12 and the part to be soldered 13 are arranged on opposite sides of the cable holding part 11.

The above opening and closing part 12 is connected to one side 11a of the cable holding part 11 by a hinge 14. Thereby, the opening and closing part 12 can be opened or closed through the hinge 14.

A lock part 11c projecting sideways is provided at the upper end of the other side 11b of the cable holding part 11. A hook part 12a to be locked to the lock part 11c is provided on the free end side of the opening and closing part 12.

By opening the opening and closing part 12, the cables 21 can be easily held in the cable holding part 11. By locking the hook part 12a with the lock part 11c, the opening and closing part 12 can be prevented from being opened accidentally.

Figure 3:
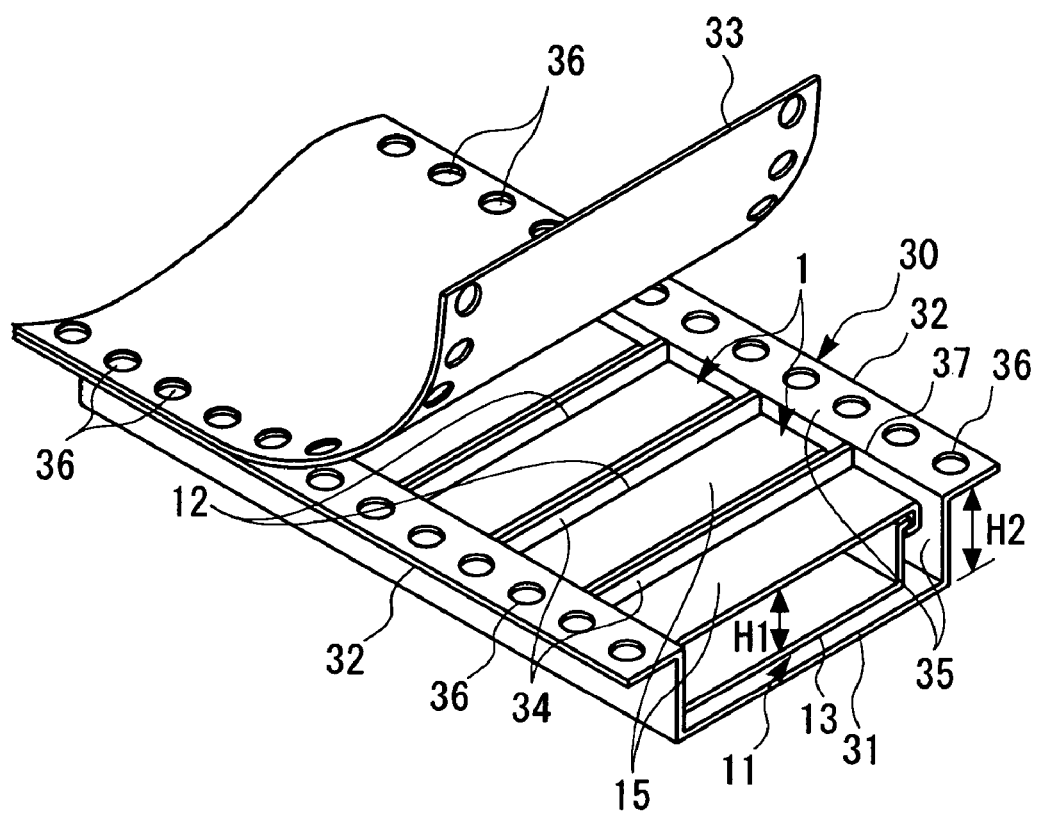
FIG. 3 is a perspective view showing a state in which the cable clamp according to the first embodiment of the present invention is contained in a carrier tape.

A large number of the cable clamps 1 are carried by a carrier tape 30 as conveyor devices as shown in FIG. 3. The carrier tape 30 has a prolonged storing part 31 having a U-shaped section, collar parts 32 and 32 extending sideways from the ends of both sides of the storing part 31, and a removable cover 33 for covering the opening 37 of the storing part 31.

The storing part 31 is partitioned into a large number of chambers 35 by partition parts 34 provided at predetermined intervals. A large number of conveyance holes 36 are formed in the collar parts 32 and the cover 33.

When the cable clamp 1 is stored in the carrier tape 30, the suction part 15 of the opening and closing part 12 is exposed outward from the opening 37 of the storing part 31. The part to be soldered 13 is opposed to the bottom of the storing part 31.

The height H1 from the opening and closing part 12 to the part to be soldered 13 of the cable clamp 1 is set slightly smaller than the depth H2 of the storing part 31 of the carrier tape 30.

To install the cable clamp 1 on the printed wiring board 20, the carrier tape 30 is carried to a predetermined position while the large number of cable clamps 1 are stored in the carrier tape 30. The cover 33 of the carrier tape 30 is then removed.

Then, the suction part 15 of the opening and closing part 12 of the cable clamp 1 at the head of the cable clamps 1 carried by the carrier tape 30 is sucked by the suction means 22 (see FIG. 1) for mounting electronic parts on the printed wiring board 20, and moved to a predetermined position on the printed wiring board 20.

The printed wiring board 20 is provided with foot prints (solder) 23 and 23 at positions where the cable clamp 1 should be installed. The cable clamp 1 is provisionally installed in such a manner that both sides of the part to be soldered 13 are brought into abut with the respective foot prints 23 and 23.

After predetermined electronic parts (not shown) and the cable clamps 1, 1, . . . are provisionally installed on the printed wiring board 20 likewise, the electronic parts and the cable clamps 1, 1, . . . are soldered to the printed wiring board 20 in a reflow furnace.

Thus, the suction part 15 of the cable clamp 1 according to the present invention can be sucked by the suction means 22 used to mount electronic parts on the printed wiring board 20. Further, the part to be soldered 13 can be also soldered to the printed wiring board 20.

Therefore, the cable clamp 1 according to the present invention can be automatically installed on the printed wiring board 20 by an automatic assembly machine for electronic parts. At this time, it is not necessary to form a hole in the printed wiring board 20.

Therefore, a reduction in the part mounting area of the printed wiring board 20 and a reduction in the degree of freedom of designing the wiring pattern of the printed wiring board 20 can be suppressed.

Since the cable clamp 1 according to the present invention can be soldered to be securely fixed to the printed wiring board 20 and does not turn, it is possible to prevent the cable clamp 1 from interfering with another mounted part adjacent to the cable clamp 1 and from being installed in a direction different from that intended by the designer and to hold the cable 21 such as an electric wire or optical fiber in a right direction.

Further, the cable clamp 1 can be installed on the printed wiring board 20 by an automatic assembly machine as in the case of installing electronic parts, the efficiency of installation work can be improved and a mistake such as that a worker fails to install the cable clamp can be prevented.

The above opening and closing part 12 can be made of an elastic material, which makes it possible to open and close the opening and closing part 12 easily.

The above opening and closing part 12 may also be made of a plastic deformable material which can change its shape, which makes it possible to open and close the opening and closing part 12 easily.

Second Embodiment

Figure 4:
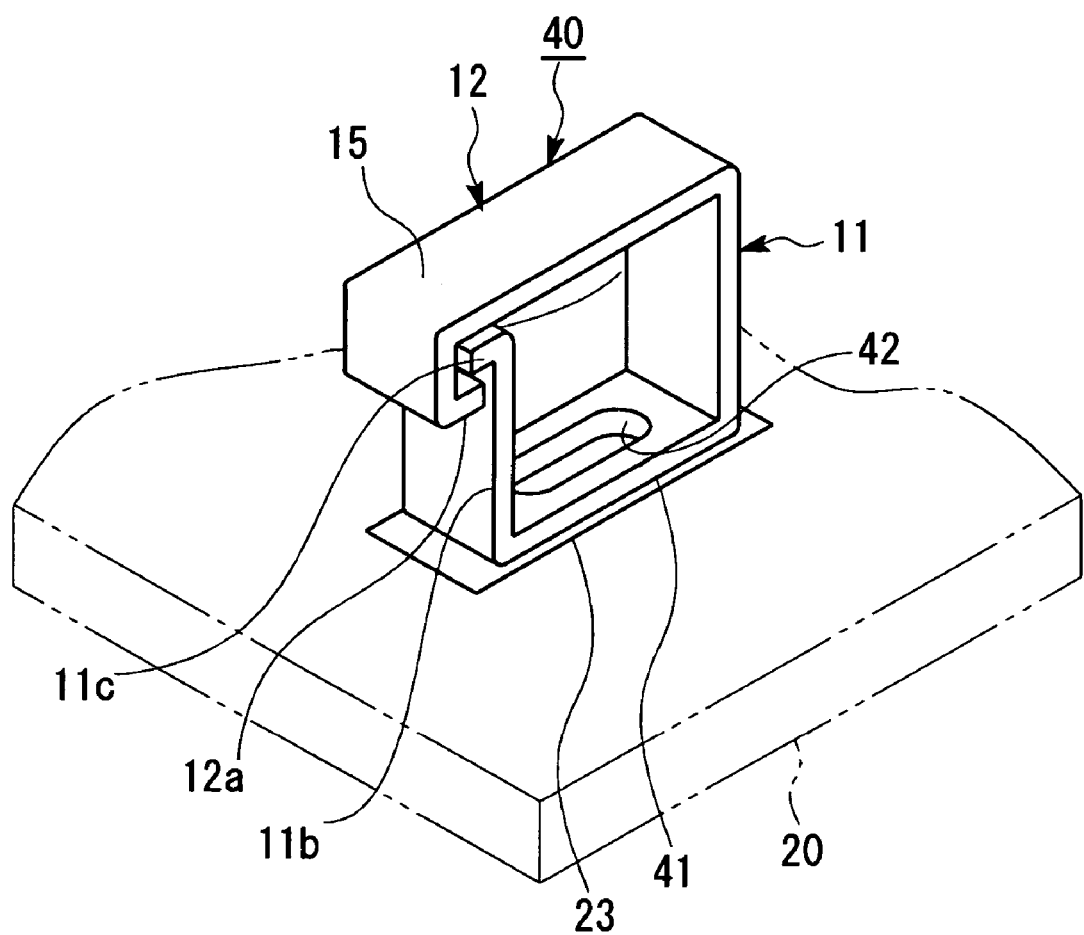
FIG. 4 is a perspective view of a cable clamp according to a second embodiment of the present invention.

FIG. 4 shows a cable clamp 40 according to a second embodiment of the present invention. In the following description, the same parts as in the cable clamp 1 of the above first embodiment are given the same reference symbols and their detailed descriptions are omitted.

The cable clamp 40 has a substantially U-shaped cable holding part 11, an opening and closing part 12, and a part to be soldered 41. A lock part 11c is provided on the other side 11b of the cable holding part 11. A flat suction part 15 is provided on the top surface of the opening and closing part 12. A hook part 12a is provided on the free end side of the opening and closing part 12.

A hole 42 having a predetermined size is formed in the part to be soldered 41. In this embodiment, the relatively long elliptic hole 42 is formed in the longitudinal direction of the rectangular part to be soldered 41.

When the part to be soldered 41 of the cable clamp 40 according to the present invention is soldered to the foot print 23 on the printed wiring board 20, heat applied to the part to be soldered 41 readily spreads to the entire part to be soldered 41, thereby making it possible to carry out soldering securely in a short period of time.

Third Embodiment

Figure 5:
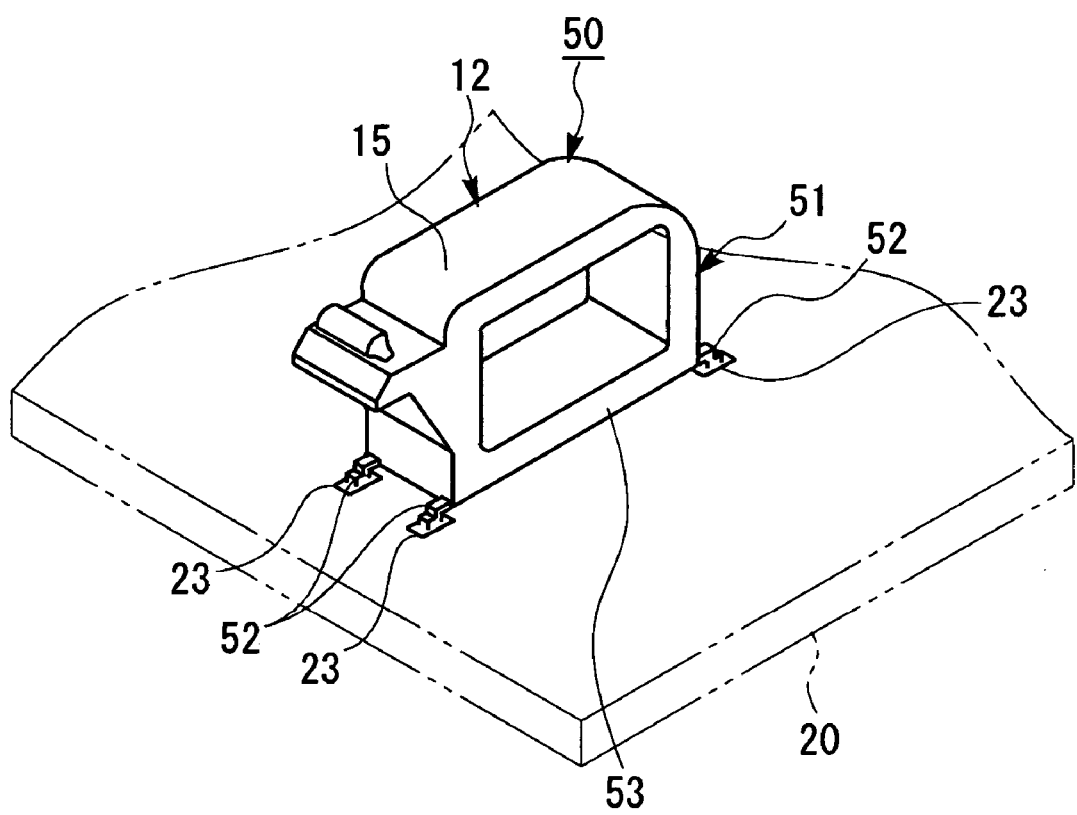
FIG. 5 is a perspective view of a cable clamp according to a third embodiment of the present invention.

FIG. 5 shows a cable clamp 50 according to a third embodiment of the present invention. The cable clamp 50 has a cable holding part 51, an opening and closing part 12, and parts to be soldered 52 and 52. A suction part 15 is provided on the flat top surface of the opening and closing part 12.

The parts to be soldered 52 and 52 project sideways from the both sides of the bottom 53 of the cable holding part 51.

The above cable holding part 51 is made of a resin which can be resistant to the inside temperature of a reflow soldering apparatus. The parts to be soldered 52 and 52 are formed like a lead, and made of a metal which can be soldered. The parts to be soldered 52 and 52 are integrated with the cable holding part 51 by insert molding.

Figure 6:
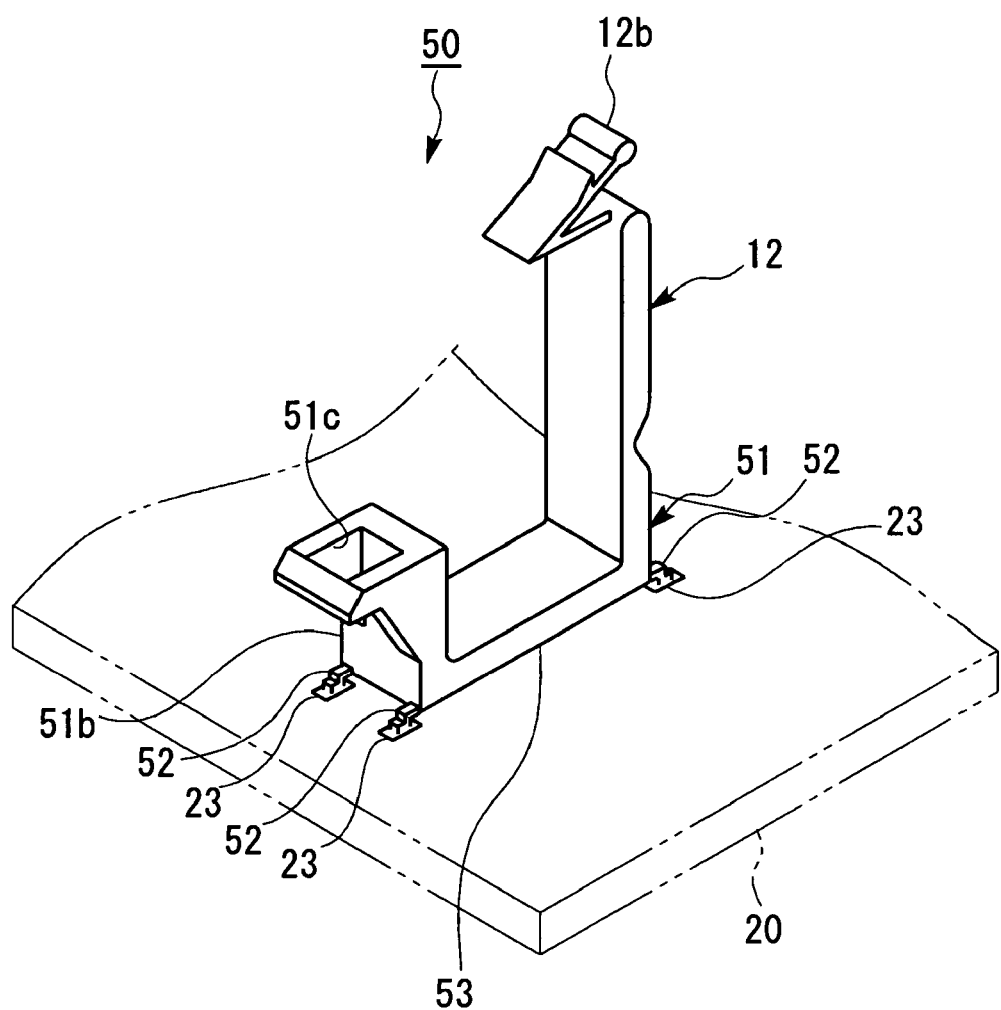
FIG. 6 is a perspective view showing a state in which the opening and closing part of the cable clamp according to the third embodiment of the present invention is opened.
Figure 7:
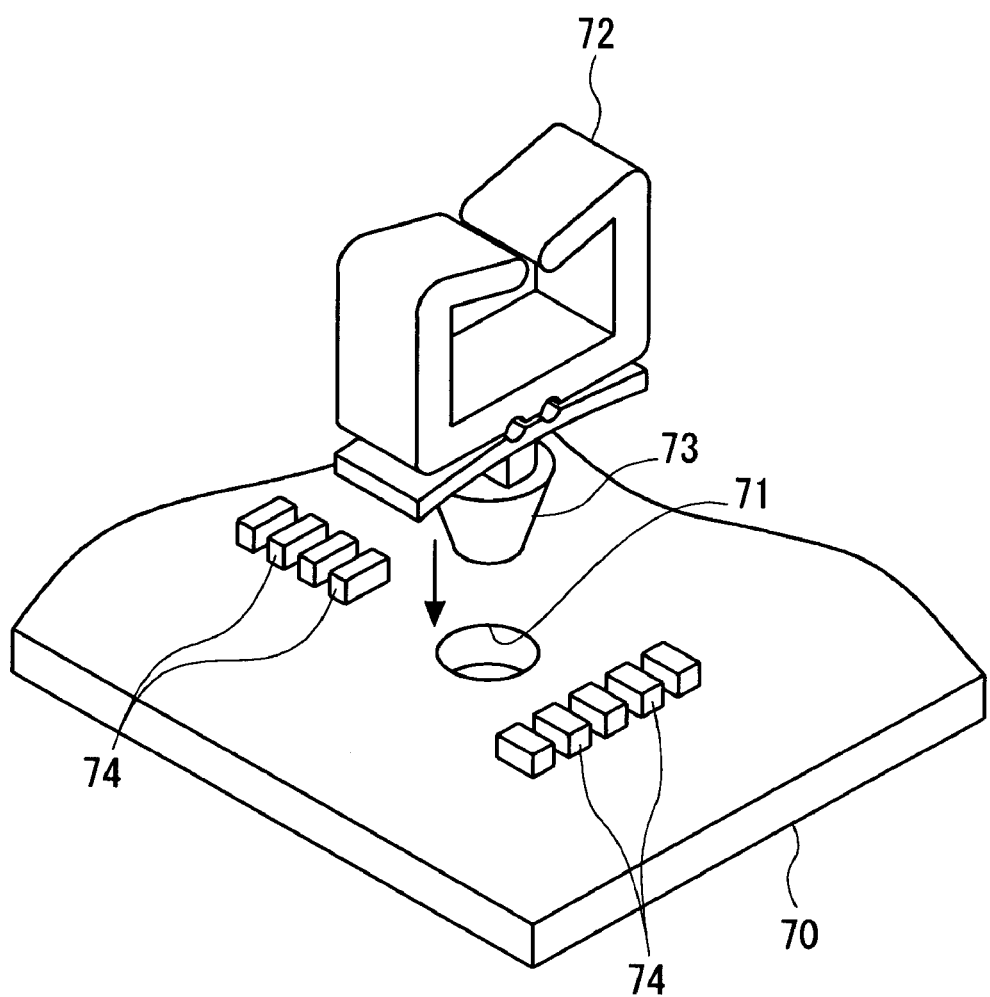
FIG. 7 is a perspective view of a cable clamp according to a conventional example.
Figure 8:
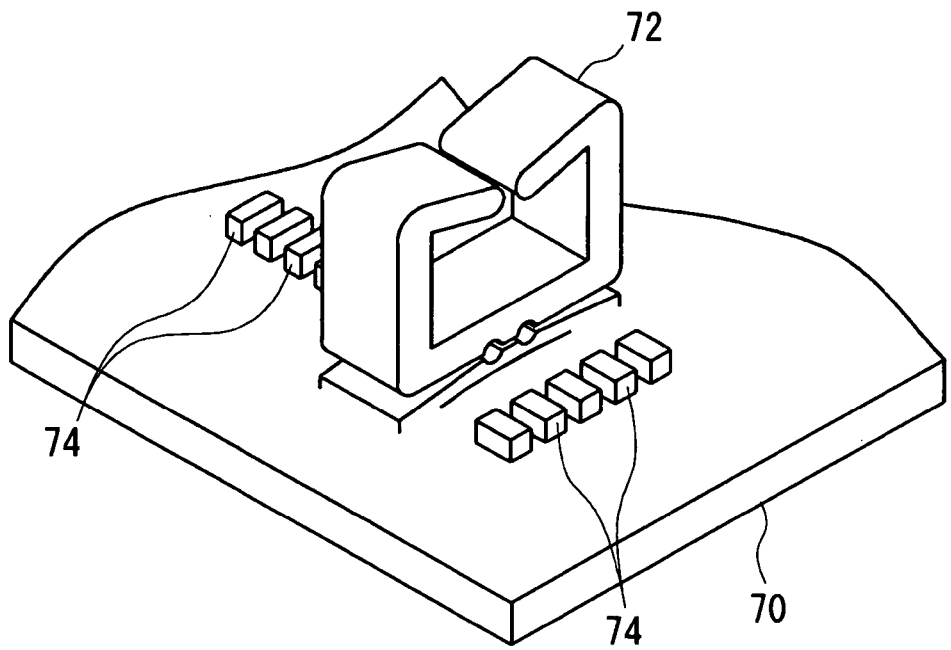
FIG. 8 is a perspective view showing a state in which the cable clamp of the conventional example is fixed on a printed wiring board.
Figure 9:
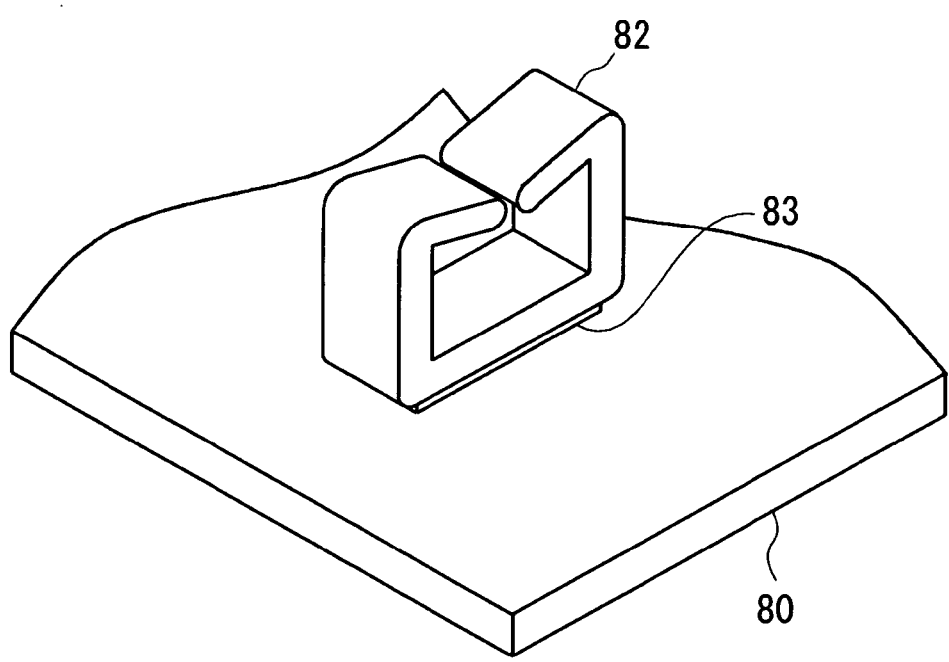
FIG. 9 is a perspective view of a cable clamp according to another conventional example.

An lock hole 51c is formed in the other side 51b of the above cable holding part 51 as shown in FIG. 6. An lock piece 12b to be engaged with the engagement hole 51c is provided on the free end side of the above opening and closing part 12.

Most part of the cable clamp 50 is made of a resin to make its molding easy. The parts to be soldered 52 and 52 are formed like a lead to reduce the size of the foot prints 23 of the printed wiring board 20. Therefore, the degree of freedom of designing the printed wiring board increases.

Others

The disclosures of Japanese patent application No.JP2005-364687 filed on Dec. 19, 2005 including the specification, drawings and abstract are incorporated herein by reference.

What is claimed is:

1. A cable clamp which is installed on a printed wiring board to hold cables at predetermined positions on the printed wiring board, comprising:
   a cable holding part for holding the cables;
   a suction part to be sucked by suction devices used to mount electronic parts on the printed wiring board; and
   a part to be soldered to the printed wiring board,
   wherein the cable clamp is installed on a surface of the printed wiring board without passing through the printed wiring board, the cable clamp being formed such that it can be stored in conveyor devices having an opening for taking out the cable clamp; and
   the suction part and the part to be soldered are provided on the opposite sides of the cable holding part, the suction part being exposed outwardly from the opening of the conveyor devices while it is stored in the conveyor devices.

2. A cable clamp which is installed on a printed wiring board to hold cables at predetermined positions on the printed wiring board, comprising:
   a cable holding part for holding the cables;
   a suction part to be sucked by suction devices used to mount electronic parts on the printed wiring board;
   a lock part for locking the cables; and
   a part to be soldered to the printed wiring board, wherein the cable clamp is installed on surface of the printed wiring board without passing through the printed wiring board, the cable clamp being formed such that it can be stored in conveyor devices having an opening for taking out the cable clamp; and the suction part and the part to be soldered are provided on the opposite sides of the cable holding part, the suction part being exposed outwardly from the opening of the conveyor devices while it is stored in the conveyor devices.

3. The cable clamp according to claim 1, further comprising;
the cable holding part, the suction part, and the part to be soldered are integrally formed of a solderable metal.

4. The cable clamp according to claim 1, further comprising;
the cable holding part is provided with an elastic opening and closing part.

5. The cable clamp according to claim 1, further comprising;
the cable holding part is provided with a plastic deformable opening and closing part.

6. The cable clamp according to claim 1, further comprising;
a hole having a predetermined size is formed in the part to be soldered.

7. The cable clamp according to claim 1, further comprising;
the cable holding part and the suction part are made of resin, and the part to be soldered is composed of a metal lead.

8. A printed wiring board, comprising:
a cable clamp which is installed on the printed wiring board to hold cables at predetermined positions on the printed wiring board, the cable clamp being formed such that it can be stored in conveyor devices having an opening for taking out the cable clamp; an electronic part mounted by the cable clamp, the cable clamp comprising:

a cable holding part for holding the cables;

a suction part to be sucked by suction devices used to mount electronic parts on the printed wiring board; and a part to be soldered to the printed wiring board, the suction part and the part to be soldered are provided on the opposite sides of the cable holding part, the suction part being exposed outwardly from the opening of the conveyor devices while it is stored in the conveyor devices.

* * * * *